US008912786B2

(12) United States Patent
Badegruber et al.

(10) Patent No.: US 8,912,786 B2

(45) Date of Patent: Dec. 16, 2014

(54) METHOD AND DEVICE FOR DETERMINING A DIRECT CURRENT AND RESISTANCE WELDING DEVICE

(75) Inventors: Thomas Badegruber, Lambach (AT); Helmut Ennsbrunner, Leonding (AT)

(73) Assignee: Fronius International GmbH, Pettenbach (AT)

( * ) Notice: Subject to any disclaimer, the term of this patent is extended or adjusted under 35 U.S.C. 154(b) by 418 days.

(21) Appl. No.: 12/998,407

(22) PCT Filed: Dec. 1, 2009

(86) PCT No.: PCT/AT2009/000465
§ 371 (c)(1),
(2), (4) Date: Apr. 15, 2011

(87) PCT Pub. No.: WO2010/065975
PCT Pub. Date: Jun. 17, 2010

(65) Prior Publication Data

US 2011/0260711 A1 Oct. 27, 2011

(30) Foreign Application Priority Data

Dec. 9, 2008 (AT) ................................ A 1915/2008

(51) Int. Cl.

| | |
|---|---|
| ***G01R 15/18*** | (2006.01) |
| ***B23K 11/25*** | (2006.01) |
| *H01F 27/40* | (2006.01) |
| *H01F 38/08* | (2006.01) |

(52) U.S. Cl.
CPC ............. *B23K 11/257* (2013.01); *G01R 15/181* (2013.01); *H01F 27/40* (2013.01); *H01F 38/085* (2013.01)
USPC ..... 324/127; 324/126; 324/117 R; 324/76.75; 324/119

(58) Field of Classification Search
CPC .... G01R 15/18; G01R 15/181; G01R 15/183; G01R 15/185; B23K 11/257
USPC ............................... 324/76.75, 119, 126, 127
See application file for complete search history.

(56) References Cited

U.S. PATENT DOCUMENTS 4,345,198 A * 8/1982 Wolfinger ....................... 322/25
5,015,945 A 5/1991 Radun (Continued)

FOREIGN PATENT DOCUMENTS

DE 26 56 817 6/1978
EP 1 249 298 10/2002

(Continued)

OTHER PUBLICATIONS

Austrian Search Report dated Oct. 30, 2009 for A 1915/2008 with English translation of relevant parts.

(Continued)

*Primary Examiner* — Huy Q Phan
*Assistant Examiner* — Dustin Dickinson
(74) *Attorney, Agent, or Firm* — Collard & Roe, P.C.

(57) ABSTRACT

The invention relates to a method and a device for determining a direct current (i(t)) flowing in a conductor (7) and having an amplitude greater than 500 A, which direct current (i(t)) is composed of a number of time-dependent partial currents ($i_i$(t)) flowing in individual conductors (8) with switching elements. To create a drift-free measured value, it is provided that at least one Rogowski coil (10) is arranged around at least one of the individual conductors (8) for the induction of a partial voltage ($u_i$(t)) through the at least one partial current ($i_i$(t)), wherein the individual conductor (8) is formed by a path of a rectifier (6) on a secondary side of a transformer (5) with central tapping, the at least one integrator (11) is designed for integration of the at least one partial voltage ($u_i$(t)), and the at least one integrator (11) is connected to an evaluation unit (12) for determining the direct current (i(t)).

14 Claims, 5 Drawing Sheets

(56) References Cited

U.S. PATENT DOCUMENTS

| | | | | |
|---|---|---|---|---|
| 5,053,695 | A * | 10/1991 | Canter | 324/117 R |
| 5,196,668 | A | 3/1993 | Kobayashi et al. | |
| 5,815,391 | A * | 9/1998 | Pelly | 363/98 |
| 5,938,947 | A | 8/1999 | Takano et al. | |
| 5,977,507 | A * | 11/1999 | Hiiro | 219/109 |
| 6,271,655 | B1 * | 8/2001 | Weber et al. | 324/117 R |
| 6,313,623 | B1 * | 11/2001 | Kojovic et al. | 324/127 |
| 6,963,195 | B1 * | 11/2005 | Berkcan | 324/117 R |
| 7,825,763 | B2 * | 11/2010 | Dupraz et al. | 336/174 |
| 8,072,154 | B2 * | 12/2011 | Facchini | 315/209 R |
| 2006/0012374 | A1 | 1/2006 | Kojovic et al. | |
| 2008/0211484 | A1 * | 9/2008 | Howell et al. | 324/127 |
| 2009/0302862 | A1 * | 12/2009 | Twerdochlib | 324/551 |
| 2011/0043190 | A1 * | 2/2011 | Farr | 324/126 |
| 2011/0227581 | A1 * | 9/2011 | Kojovic et al. | 324/524 |

FOREIGN PATENT DOCUMENTS

| | | |
|---|---|---|
| GB | 2 321 539 | 7/1998 |
| JP | 61-271466 | 12/1986 |
| JP | H10-211584 A | 8/1998 |
| WO | 2008044120 A2 | 4/2008 |

OTHER PUBLICATIONS

International Search Report.

Chinese Office Action in 200980149006.2, dated Jul. 29, 2013, with English translation of relevant parts.

Japanese Office Action dated Dec. 24, 2013 in Japanese Application No. 2011-539843.

* cited by examiner 10
7
i(t)
u(t)
x(t)
11
9
9
9
8
8
8
6

7
i(t)
9
10
8
ii(t)
ui(t)
xi(t)
11
ii+1(t)
ui+1(t)
xi+1(t)
12
13

METHOD AND DEVICE FOR DETERMINING A DIRECT CURRENT AND RESISTANCE WELDING DEVICE

CROSS REFERENCE TO RELATED APPLICATIONS

This application is the National Stage of PCT/AT2009/000465 filed on Dec. 1, 2009, which claims priority under 35 U.S.C. §119 of Austrian Application No. A 1915/2008 filed on Dec. 9, 2008, the disclosure of which is incorporated by reference. The international application under PCT article 21(2) was not published in English.

The invention relates to a method for determining a direct current flowing in a conductor and having an amplitude greater than 500 A, which direct current is composed of a number of time-dependent partial currents flowing in individual conductors with switching elements.

Furthermore, the invention relates to a device for determining a direct current flowing in a conductor and having an amplitude greater than 500 A, which direct current is composed of a number of time-dependent partial currents flowing in individual conductors with switching elements.

Furthermore, the present invention relates to a device for resistance welding having two electrodes which are movable relative to one another and are connected to a power source for providing a direct current for welding having an amplitude greater than 500 A, wherein the power source comprises at least one transformer and one rectifier having switching elements for delivering time-dependent partial currents flowing in individual conductors, and having a device for determining the direct current.

The present invention relates to the determination of high amplitude direct currents as they occur for example in resistance welding devices or also in battery chargers. Measuring the direct current is essential for controlling the welding process or controlling the charging process and for ensuring a consistent welding quality or an optimum charging process. Also, time-dependent currents of different courses, the average value whereof is unequal to zero, are embraced by the term direct current.

Measuring direct currents having an amplitude greater than 500 A, as they for example occur in resistance welding methods, can be accomplished by means of shunt resistors. Such shunt resistors for high currents are extremely heavy and must show high-precision values. In addition, for avoiding temperature dependence an appropriate temperature compensation is required. Due to the high effort associated therewith such current measuring methods for direct currents having an amplitude greater than 500 A are in general not suited for series application.

Also classic current transformers require a relatively high space, for which reason they can indeed be used for calibrations, but are not feasible for permanent measures of a direct current in series applications.

An improvement can be achieved in that the direct current is detected indirectly via the voltage induced in a coil. For this purpose a so-called Rogowski coil is arranged around the current-carrying conductor, so that the current flowing through the conductor creates a magnetic field inducing a voltage within the Rogowski coil. In order to be able to conclude the conductor current the time integral of the induced voltage has to be formed. This way, one obtains a voltage proportional to the measured current. In contrast to traditional current transformers Rogowski coils are formed significantly smaller due to the missing ferrite core. Furthermore, non-linear influences of the ferrite core do not apply.

The Rogowski coil is arranged in a common conductor for example to the resistance welding gun, in order to measure the total of all partial currents of the transformer in one measuring process.

However, the integrators required for the Rogowski current measuring negatively influence the accuracy of the measurement result, because the transfer function thereof is not BIBO stable (Bounded Input Bounded Output stable) and is, thus, resulting in the measuring signal drifting off with increasing measurement time. Said drifting off is not to be distinguished from the measuring signal in measuring low frequency currents—particularly direct currents. In resistance welding devices an incorrect drift of measuring signal, which is proportional to welding current, might occur in long welding times of for example one to several seconds. Thus, for example instead of 10 kA for the welding current only 8 kA might be measured at the end of the welding. Again, due to wrong measured values quality losses in welding spots might appear, since the welding current is controlled such that the actual value, which is defective, equals the desired value.

Thus, it is necessarily imperative to at least reduce or avoid said drift of welding current caused by the integrators.

For example, DE 26 56 817 A1 describes a current transducer for the potential separating detection of the actual current value in a conductor using a Rogowski coil, wherein the integrator is short-circuited or reset when the clocked direct current to be measured became zero. Apart from that, that this document does not relate to the measurement of particularly high currents (greater than 500 A), resetting the integrator can only be accomplished when the current in the conductor is zero. That means that resetting is for example accomplished prior or following a welding.

For measuring direct currents during a current flow, as they occur in resistance welding devices, battery chargers, etc., and which in general do not become zero during a welding, a charging process, etc., this principle is, thus, not suited. Since no quality assurance could be performed by use thereof.

In general, it is prior art in resistance welding devices that the direct current required for a welding is measured by means of a Rogowski coil. In doing so, it is a disadvantage that the integrator required thereto can only be reset prior to a welding. Hence, extremely complex integrator circuits are necessary, causing as less drift as possible during the time of welding. When a drifting off of an integrator for welding current measurement occurs, then often the desired value demand of the parameters for a welding is adjusted, in order to obtain the demanded quality of the welding spot in the system.

This results in the disadvantage that those parameters can not be transferred to a comparable resistance welding device one-to-one, since the integrator behavior is different at least due to component deviations. In general, it should also be considered that for a resistance welding device at least one welding transformer with integrated rectifier unit (power source) and one converter with current control are required. Also, in the welding transformer the Rogowski coil is integrated, wherein the integrator is part of the converter. Also, the welding transformer and the converter are not necessarily produced by one manufacturer. That means that the welding transformer is designed such that it can be used with any converter of different manufacturers. This is also controlled by appropriate codes and instruction leaflets.

For example JP 61-271466 A describes such a resistance welding system, in which a voltage induced by the primary side current is detected and evaluated. To reduce the drift of measured values very high requirements for the integrator circuit would be necessary.

The aim of the present invention and the object associated therewith is thus the creation of a method and a device by which the direct current having an amplitude greater than 500 A can be determined as accurate as possible. Method or devices, respectively, should be as simple and inexpensive in operation and assembly as possible. Disadvantages of known methods and devices should be avoided or at least be reduced.

The present object is solved by a method mentioned above, in which at least one induced partial voltage is created by the partial current flowing in at least one individual conductor by arranging at least one Rogowski coil around at least one individual conductor, wherein the individual conductor is formed by a path of a rectifier on a secondary side of a transformer with central tapping, and said induced partial voltage is integrated in at least one integrator, and the direct current is determined with an evaluation unit connected to the at least one integrator. So, according to the invention, the Rogowski coil is not placed in the current path of the direct current to be measured (as for example a direct current for a resistance welding) as usual in resistance welding systems, but in an individual conductor, which carries a partial current of the direct current to be measured. This way, the direct current can be determined due to the partial currents. In the configuration of the partial current sections it is significant that this partial current has the property of becoming zero temporarily. Hence, the partial currents have time sections, in which it is guaranteed that the associated partial current becomes zero. Due to these time sections the integrator can now be actuated such that the drift thereof is minimized to a negligible low value, since the measurement is influenced at a time when partial currents are zero, that is Rogowski coils are reset. By this measure also high amplitude direct currents (in a resistance welding of up to 200 kA) can be determined during a welding or a charging process with high accuracy using Rogowski coils and integrators, since the drifting off of integrators can be avoided or reduced. The method of the invention is characterized by relative simplicity and a robustness associated therewith, wherefore an application in for example resistance welding processes or battery charging processes is ideally possible. It is also advantageous that with the use or connecting of a traditional hardware according to the invention a great improvement of the measurement accuracy is inexpensively enabled. Hence, it is possible that the Rogowski coil can also be employed for measuring in other power supply systems, delivering a direct current over a long period of time, such as the charging of batteries, since the Rogowski coil can be reset consistently and thus drifting off is prevented.

According to an alternative of the present method it is provided that a sum voltage is formed of at least two partial voltages induced in two Rogowski coils wired equally opposed, and it is integrated in an integrator. Preferably, at least two Rogowski coils for measuring the partial voltages induced by the partial currents in at least two individual conductors are provided. According to the invention, by appropriate arrangement of Rogowski coils in the individual conductors due to the partial currents of the direct current to be measured a sum voltage significantly without mean value is supplied to the shared integrator. This way for example both partial currents of a rectifier consisting of two branches can be measured and hence a value proportional to the direct current to be measured can be concluded. Since the sum voltage has no mean value the drift can be minimized. Also, resetting the integrator is not required.

According to a further feature of the invention, a differential voltage induced in a Rogowski coil is formed of a current difference formed of at least two partial currents directed opposite. In practice this is achieved in that the at least two individual conductors are carried through the Rogowski coil equally opposed so that the difference of the currents induces a differential voltage in the Rogowski coil. This is practically mean value free so that the drift within the integrator is prevented or minimized, and the direct current can be determined. Also, resetting the integrator is thus not required.

Alternatively or in addition to the measure of mean value freedom of the signal supplied to the integrator any integrator of the evaluation unit can also be periodically reset during the flowing of a direct current, when the at least one partial current in the individual conductor causing the at least one induced partial voltage is ≤ zero. Also, phases or time sections of the partial currents in the individual conductors are utilized, during which the partial currents are ≤ zero (so-called zero current phases) and these phases are used for resetting integrators.

According to a feature of the invention any integrator is reset when the switching element in the individual conductor of the at least one partial current causing the partial voltage to be integrated is opened. Hence, by monitoring the switching element in the individual conductor it is detected, whether or not the partial current in that individual conductor is zero, and accordingly the integrator is reset.

The method of the invention is preferably applied in a device according to the following description.

The object of the invention is also solved by a device mentioned above for determining a direct current flowing in a conductor, wherein at least one Rogowski coil is arranged around at least one individual conductor for the induction of a partial voltage through the at least one partial current, wherein the individual conductor is formed by a path of the rectifier on the secondary side of the transformer with central tapping, the at least one integrator is designed for integration of the at least one partial voltage, and the at least one integrator is connected to an evaluation unit for determining the direct current. As already mentioned above, by arrangement of the at least one Rogowski coil around one individual conductor of the rectifier a drifting off of the integrator connected downstream the Rogowski coil during the zero current phases is effectively prevented or reduced, since in this phase it can be reset.

The object of the invention is also solved by a device mentioned above for resistance welding, wherein at least one Rogowski coil is arranged around at least one individual conductor for the induction of a partial voltage through the at least one partial current, wherein the individual conductor is formed by a path of the rectifier on the secondary side of the transformer with central tapping, the at least one integrator is designed for integration of the at least one partial voltage, and the at least one integrator is connected to an evaluation unit for determining the direct current.

Advantageously, at least two Rogowski coils are arranged around at least two individual conductors equally opposed, and the Rogowski coils are connected to each other and to the one integrator for taking a mean value free sum voltage of the partial voltages induced in the Rogowski coils. This way, as already mentioned above, a significantly mean value free sum voltage can be supplied to the shared integrator.

Alternatively, also a Rogowski coil can be arranged around at least two individual conductors running equally opposed, and the Rogowski coil can be connected to the one integrator for taking a mean value free differential voltage of a current difference of the partial currents.

According to another feature of the invention any integrator can periodically be reset during the direct current flow when the at least one partial current flowing in the individual conductor and causing at least one induced partial voltage is ≤ zero.

Preferably, the at least one integrator is respectively connected to at least one switching element of an individual conductor so that the integrator can be reset, when the switching element of the individual conductor is opened.

According to another feature of the invention it is provided that switching elements of the device are formed by diodes.

Advantageously, at least two Rogowski coils are each arranged around an individual conductor each carrying a partial current of the total current to be measured.

In doing so, each Rogowski coil can be connected to one integrator each, or all Rogowski coils can be connected to an integrator.

In order to avoid the results of measurement from being influenced by external magnetic fields, the Rogowski coils can be provided with a shielding plate.

In order to record the course of the direct current, particularly the welding current, or a signal proportional thereto, the at least one integrator is preferably connected to a memory. The memory can be integrated in the evaluation unit but can also be arranged externally. The external memory can for example be connected to the evaluation unit via a network.

The device is preferably used for practicing the mentioned above method for determining a direct current.

The present invention is explained in more detail with the help of the attached drawings. In which.

Figure 1:
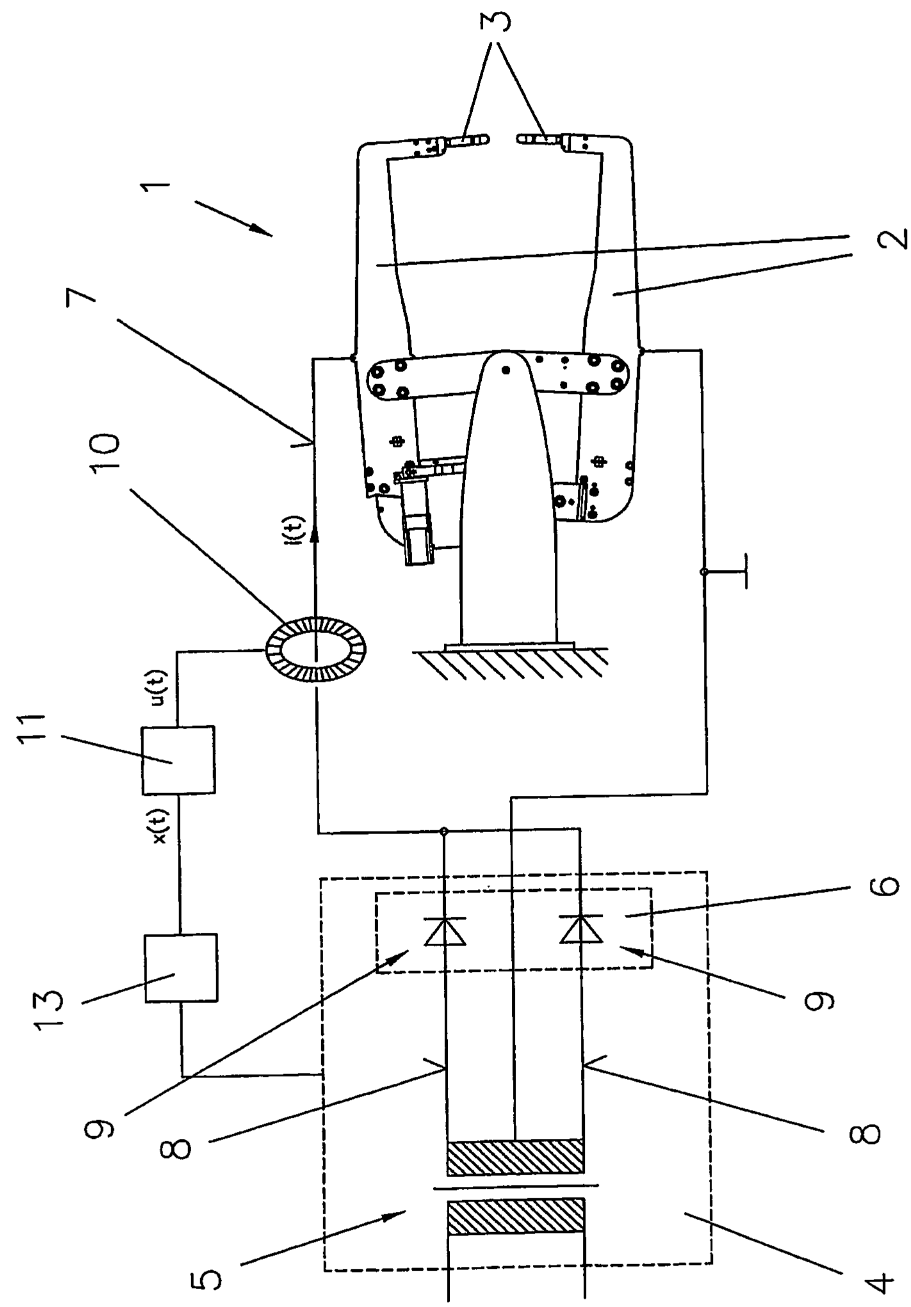
FIG. 1 shows a circuit diagram of a traditional method for measuring a welding current by means of a Rogowski coil.

FIG. 1 schematically shows a resistance welding device 1 having a traditional measurement of the direct current i(t), which hereinafter is described as welding current i(t). The resistance welding device 1 comprises two welding arms 2, on which electrodes 3 are fixed. The workpieces to be welded (not shown) are arranged between the electrodes 3. To weld the workpieces the electrodes 3 are pressed against the workpieces and supplied with the welding current i(t) such that the workpieces are melted on and connected with each other because of the current flow. For supplying the electrodes 3 with the welding current i(t) they are connected to a power source 4, which usually comprises a transformer 5 and a rectifier 6. This way the welding current i(t) is created in a usual magnitude of several kA as low loss as possible. For measuring the welding current i(t) usually a Rogowski coil 10 is arranged around a conductor 7 carrying the welding current i(t) to the electrodes 3. Voltage u(t) induced in Rogowski coil 10 because of welding current i(t) is integrated in an integrator 11 and delivers a signal x(t) proportional to welding current i(t). The signal x(t) proportional to welding current i(t) can be used for quality control and/or for controlling a control device 13 or power source 4 of resistance welding device 1. As already mentioned above, by integration of the induced voltage u(t) received by Rogowski coil 10 it inevitably comes to a drift and to incorrect measurements of welding current i(t). The errors caused by the drift can be relatively high and are thus necessarily to be avoided to ensure quality of welding. In prior art the drift occurs because measurement is done over the entire time section of the welding and a reset of the integrator is not possible, since the measured current does not become zero. Hence, in longer weldings, as it is more often the case, considerable deviations can appear. If such a drifting off case occurs, a change of setpoint values, that is desired values, is done for the subsequent measurement due to the measurement, so that it is for example possible that a safe weld joint can't be created any more.

Figure 2:
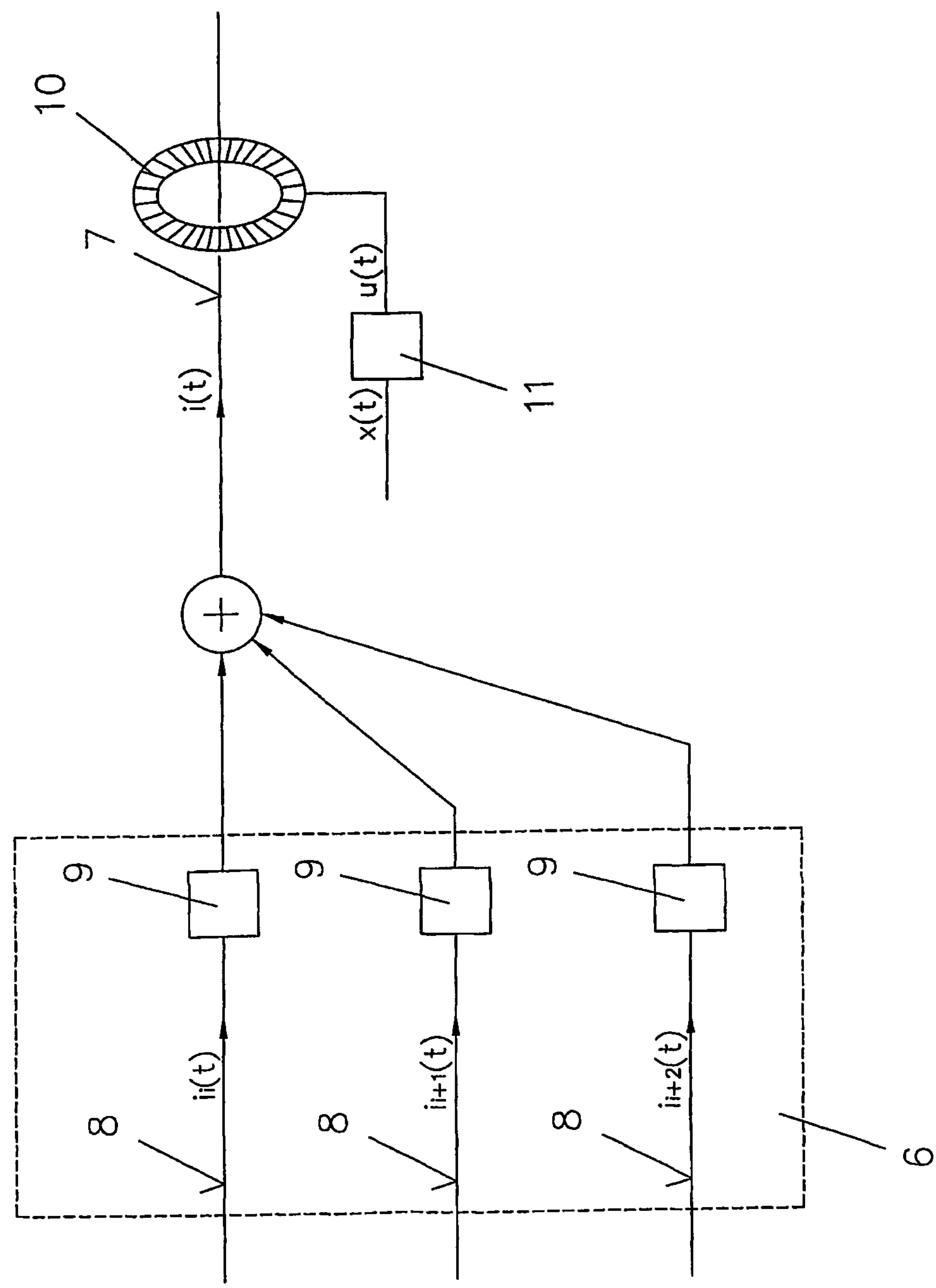
FIG. 2 shows the principle circuit diagram of measuring a direct current composed of a number of partial currents by means of a Rogowski coil according to prior art.

FIG. 2 shows a schematic circuit diagram for illustration of the method for measuring the welding current i(t) flowing in conductor 7 by means of a Rogowski coil 10. The welding current i(t) to be measured is composed of a number of partial currents $i_i(t)$, of a rectifier 6 such as in resistance welding device 1 according to FIG. 1. Said partial currents $i_i(t)$, $i_{i+1}(t)$, . . . flow through a number of individual conductors 8 provided with switching elements 9 to a sum point, ending in conductor 7. According to prior art Rogowski coil 10 for measuring the welding current i(t) is arranged around conductor 7 and detects the voltage u(t) induced by the welding current i(t), which is integrated in an integrator 11 connected to the Rogowski coil 10, and supplies a signal x(t) proportional to welding current i(t) to be measured. As already mentioned above, in measuring the welding current i(t) the necessary integrator 11 always causes a drifting off of signal x(t), since integrator 11 can only be reset prior or following a welding.

Figure 3:
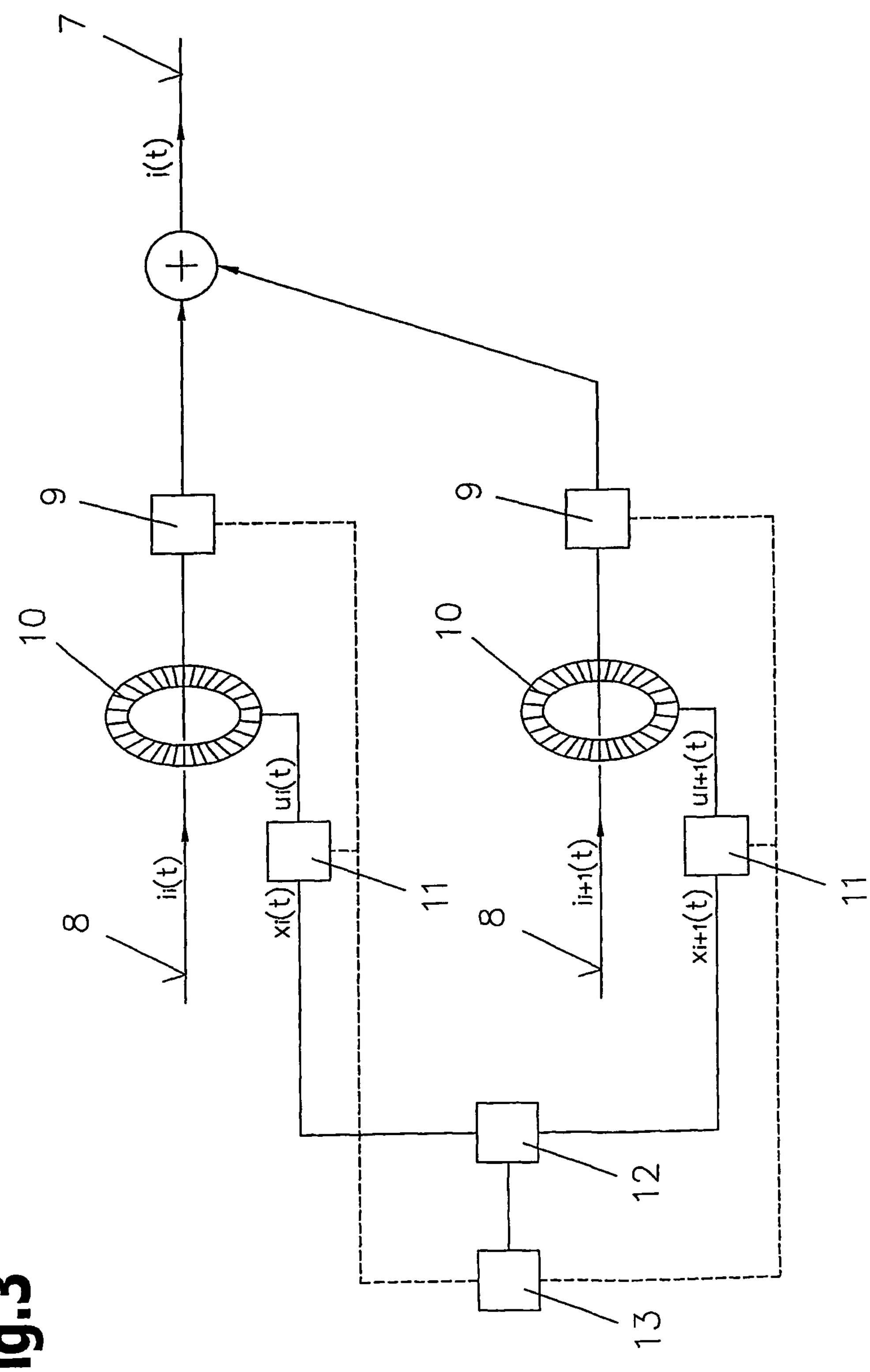
FIG. 3 shows the principle circuit diagram of the method according to the invention for measuring a direct current by means of Rogowski coils.
Figure 5:
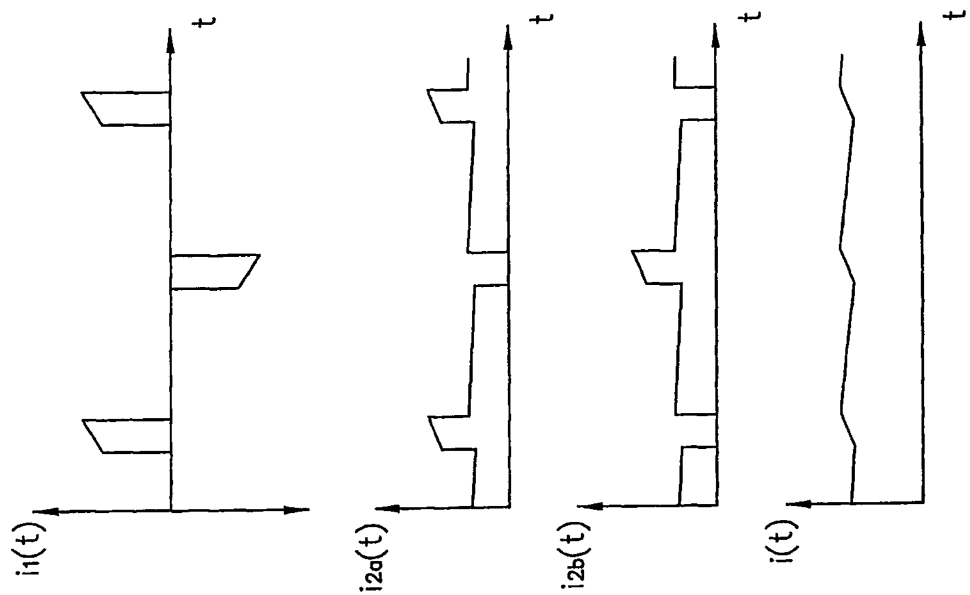
FIG. 5 shows the appropriate current courses in dependence of time.

FIG. 3 shows a schematic circuit diagram of the method according to the invention. In this case it is considered that the welding current i(t) to be determined is formed by a number of partial currents $i_i(t)$, $i_{i+1}(t)$, . . . , wherein two partial currents $i_i(t)$ and $i_{i+1}(t)$, . . . are presented. Hence, by measuring at least one of the partial currents $i_i(t)$, $i_{i+1}(t)$, . . . during a welding or during a current flow (during flowing of welding current i(t)) the welding current i(t) can be concluded or the welding current i(t) can be determined by means of an evaluation unit 12. In doing so, evaluation unit 12 determines the welding current i(t) during the welding based on a proportional signal x(t) of the integrator 11. Thus, according to the invention the relevant welding current i(t) is not measured directly during the welding, but at least one of the partial currents $i_i(t)$, $i_{i+1}(t)$ is measured during the welding, from which the welding current i(t) is determined during the welding. Hence, the voltage u(t) induced in Rogowski coil 10 is not created by the welding current i(t), but accordingly by the partial currents $i_i(t)$, $i_{i+1}$, . . . Measuring the partial current such as partial current $i_i(t)$ is significantly sufficient, since a symmetric operation of transformer 5 can be assumed. By measuring a number of the partial currents $i_i(t)$, the accuracy is slightly increased. The active or passive switching elements 9 arranged in the individual conductors 8 cause certain current courses of partial currents $i_i(t)$, $i_{i+1}(t)$, . . . by switching on or off, and also guarantee time sections, in which the associated partial current $i_i(t)$, $i_{i+1}(t)$, . . . in individual conductor 8 significantly becomes zero. That means the partial current $i_i(t)$ in opened switching element 9 (for example a cut-off diode) is that low that it can be considered as significantly zero or ≤ zero. When the partial currents $i_i(t)$, $i_{i+1}(t)$, . . . are now measured on these individual conductors 8 by means of Rogowski coils 10—that is the partial voltage $u_i(t)$, $u_{i+1}(t)$, . . . induced because of the partial currents $i_i(t)$, $i_{i+1}(t)$, . . . flowing in individual conductors 8 are supplied and integrated into integrator 11—those time sections, in which it is guaranteed that a current flow is not present in individual conductor 8 (zero current phase) can be used for resetting the associated integrator 11. By this measure also high amplitude direct currents—such as welding current i(t)—can be determined with high accuracy, because a drifting off of integrators 11 is not about to appear. To detect time sections, during which the partial currents $i_i(t)$, $i_{i+i}(t)$, . . . are zero, switching elements 9 in individual conductors 8 can be monitored. This is illustrated by the dashed line between switching elements 9 and integrators 11. Likewise, switching elements 9 and/or integrator 11 can also be connected to control device 13. Finally, a signal $x_i(t)$, $x_{i+1}(t)$, . . . proportional to the partial currents $i_i(t)$, is supplied from the integrators 11 to an evaluation unit 12, so that the welding current i(t) can be determined exactly or the welding current i(t) can be concluded. The evaluation unit 12 is preferably connected to the control device 13 as well so that a difference between determined and predefined welding current i(t) can be balanced or readjusted.

This principle can now be used differently as described by the following FIGS. 4 to 7.

Figure 4:
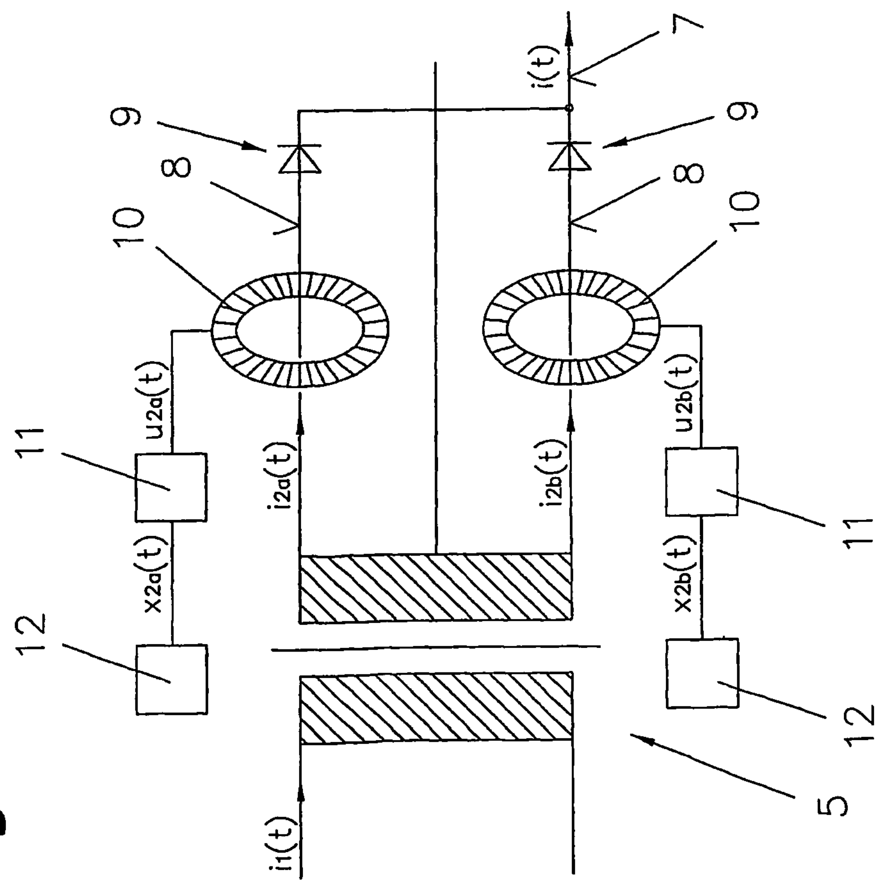
FIG. 4 shows the application of the method according to the invention in a resistance welding device.

FIG. 4 shows the application of the method according to the invention in a resistance welding device 1, wherein for the sake of simplicity only transformer 5 and rectifier 6 are drawn in. During the welding the welding current i(t) flows on a conductor 7 to electrodes 3 of resistance welding device 1 (not shown). Welding current i(t) is created by means of a pulsed current $i_i(t)$, which is supplied to a transformer 5 on the primary side having a frequency in the range of about 1 kHz. On the secondary side of transformer 5 with central tapping a rectifier 6 formed of two diodes as switching elements 9 is arranged. Accordingly, on the secondary side two individual conductors 8 and two partial currents $i_i(t)$ and $i_{i+1}(t)$ are present, wherein hereinafter for the partial currents designation $i_{2a}(t)$ and $i_{2b}(t)$ instead of $i_i(t)$ and $i_{i+1}(t)$ is used. This should also express that partial currents are significantly identical. The welding current i(t) is significantly a pure direct current as illustrated in the current courses according to FIG. 5. Now, these partial currents $i_{2a}(t)$ and $i_{2b}(t)$ each show phases or time sections, during which the respective partial current $i_{2a}(t)$ and $i_{2b}(t)$ is zero (zero current phase). Accordingly, the zero current phase of a partial current $i_{2a}(t)$ during the positive pulse of the pulsed current is $i_1(t)$ and the zero current phase of the further partial current $i_{2b}(t)$ during the negative pulse of the pulsed current is $i_1(t)$. Likewise, the zero current phase in partial current $i_{2a}(t)$ corresponds to the full current phase in $i_{2b}(t)$ and vice versa. Now, when the Rogowski coils 10 are arranged around the individual conductors 8 on the secondary side of transformer 5 according to the invention, zero current phases, that is phases during which partial currents $i_{2a}(t)$ and $i_{2b}(t)$ are zero, can be used for resetting integrators 11. Resetting can be realized software-technically or hardware-technically and is done periodically during welding. For example periodically according to the frequency of the pulsed current $i_1(t)$. By resetting the drift already mentioned several times is prevented. Hence, signals $x_a(t)$ and $x_b(t)$ proportional to partial currents $i_{2a}(t)$ and $i_{2b}(t)$ or induced partial voltages $u_{2a}(t)$ and $u_{2b}(t)$ and consequently to welding current i(t) can be delivered by integrator 11 such that welding current i(t) can be determined by evaluation unit 12 very accurately. (Also, according to partial currents the designation for the partial voltages was selected.) In contrast to prior art the welding time can be arbitrarily long, without influencing measurement accuracy of the current i(t).

Figure 6:
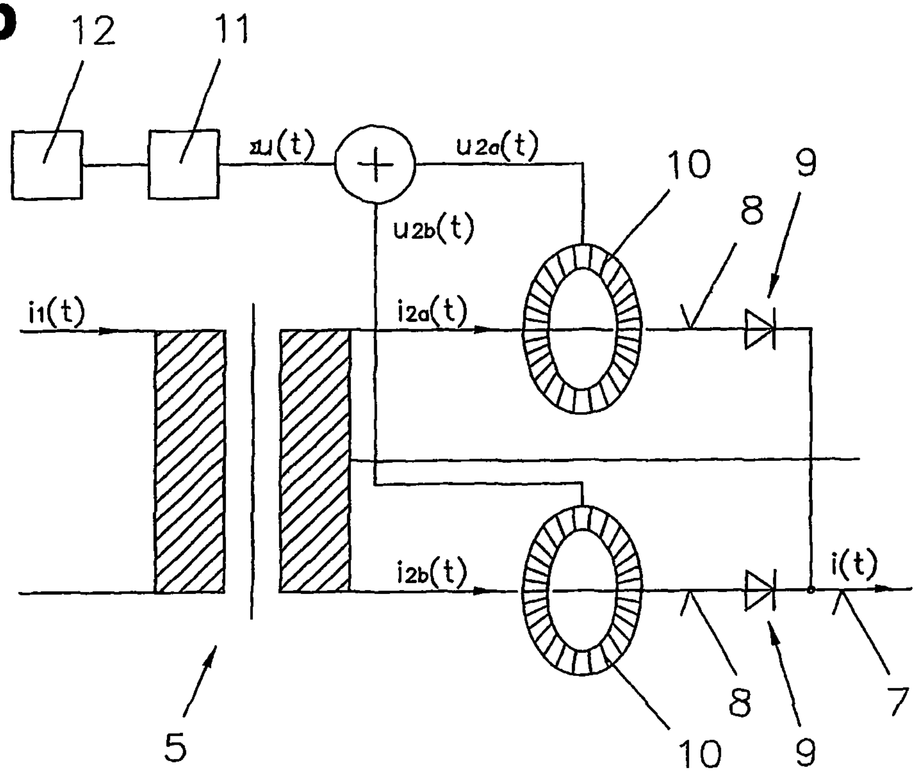
FIGS. 6 and 7 show two alternative embodiments of the method according to the invention applied on a resistance welding device.

FIG. 6 shows an alternative embodiment of the invention, in which two Rogowski coils 2 are arranged equally opposed around an individual conductor 8 each—which correspondingly induce the partial voltages $u_{2a}(t)$, $u_{2b}(t)$—on the secondary side of transformer 5 and connected to a shared integrator 11. That means that the Rogowski coils 10 are connected in series wired equally opposed. This way, a significantly mean value free common sum voltage $\Sigma u(t)$ is delivered from the induced partial voltages $u_{2a}(t)$ and $u_{2b}(t)$ of both Rogowski coils 10, which is supplied to integrator 11 and integrated. Due to the mean value freedom of sum voltage $\Sigma u(t)$ the drift of integrator 11 can be avoided or be considerably reduced.

Figure 7:
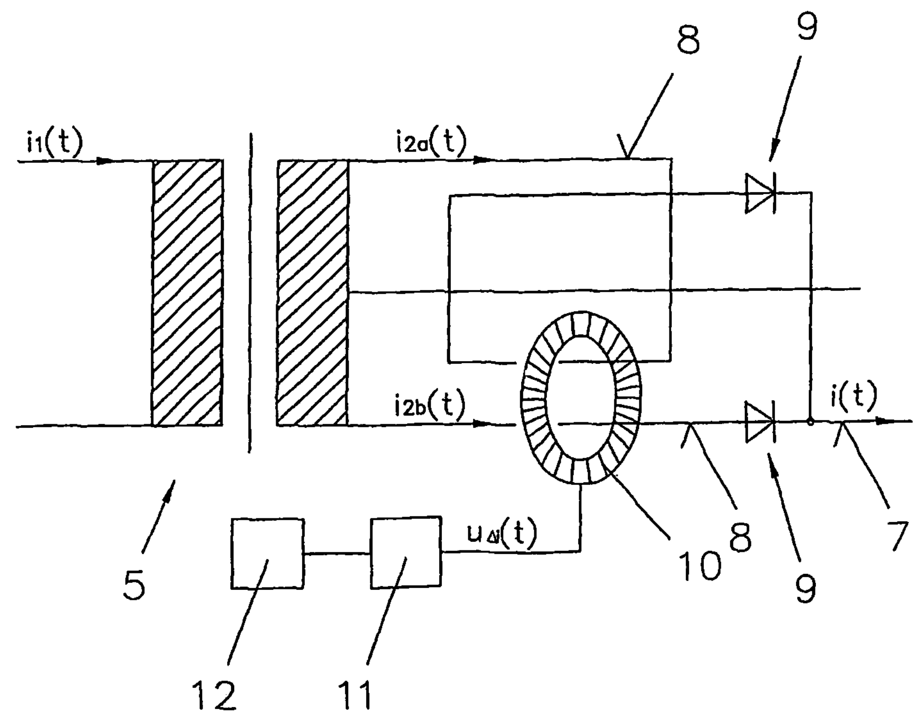

In variation according to FIG. 7 only one Rogowski coil 10 is used, which comprises the individual conductors 8 of both partial currents $i_{2a}(t)$ and $i_{2b}(t)$ such that an individual conductor 8 carrying partial current $i_{2a}(t)$ is oriented opposed to individual conductor 8 carrying partial current $i_{2b}(t)$. Thus in Rogowski coil 10 a differential voltage $u_{\Delta i}(t)$ is induced. Said differential voltage $u_{\Delta i}(t)$ is formed of the current difference $\Delta i(t)$ between partial currents $i_{2a}(t)$ and $i_{2b}(t)$. By this arrangement the differential voltage $u_{\Delta i}(t)$ is practically mean value free, whereby a drift of integrator 11 can not occur.

It is additionally mentioned to descriptions of FIGS. 6 and 7 that integrator 11 doesn't have to be reset, since it processes a mean value free voltage (in contrast to FIG. 4). This mean value freedom is only given by the use of a transformer representing a distinctive difference to prior art. Hence, the signal delivered from integrator 11 can be evaluated by means of a BIBO stable transfer function—which corresponds to approximate integration—in the evaluation unit 12, and the welding current i(t) can be correctly determined during welding.

In general it is still to be mentioned to figures described that the arrangement of Rogowski coil 10 around the individual conductor 8 according to the invention is important. Individual conductor 8 is preferably formed by a path of rectifier 6 on the secondary side of transformer 5. Rectifier 6 is for example part of at least one component for performing a welding, a battery charging process or a conversion of direct current into alternating current. It is thereby regardless, whether or not switching element 9 is arranged prior or following Rogowski coil 10.

Also, integrator 11 can generally be seen as a technical system responding to any input signal—like induced voltage u(t)—with an output signal x(t), which is proportional to the time integral of input signal. Integrator 11 can be realized by most different analog circuits but also by digital computer systems connected via analog-to-digital converters or digital-to-analog converters. Such systems are accordingly be called integrators 11. The analog integrator circuit can for example consist of active parts (operational amplifiers, transistors, etc.) and also passive parts (ohmic resistances, inductors, capacitors, etc.). The digital computer system for realizing of integrators 11 can for example be a digital signal processor, a microprocessor or also a traditional PC.

A technical system responding to certain signal classes (as for example induced voltage u(t)) with an output signal x(t), which is proportional to the time integral of input signal, is called approximate integrator. Such systems can be realized BIBO stable in contrast to integrators 11.

Although in the above description mainly resistance welding methods are referred to the present invention can also be employed for measuring other high direct currents such as occurring in battery charging devices.

The invention claimed is:

1. A method for determining a direct current flowing in a conductor during a process harnessing the direct current, the direct current having an amplitude greater than 500 A and being composed of a number of time-dependent partial currents flowing in first and second individual conductors having first and second switching elements, respectively, wherein at least one induced partial voltage is created by the partial current flowing in the first individual conductor by arranging at least one Rogowski coil around the first individual conductor, wherein each of the first and second individual conductors is formed by a respective path of a rectifier on a secondary side of a transformer with central tapping, and the induced partial voltage is integrated in at least one integrator and the direct current is determined with an evaluation unit connected to the at least one integrator, wherein during the process the partial current flowing in the first individual conductor is measured and becomes zero temporarily while partial current flows simultaneously in the second individual conductor, and wherein the at least one integrator is connected to the at least one Rogowski coil and is reset when the partial current in the first individual conductor is zero.

2. The method according to claim 1, wherein a differential voltage is induced in the at least one Rogowski coil and is formed by a current difference formed by at least two partial currents oriented opposed.

3. The method according to claim 1, wherein the at least one integrator is reset when the switching element in the first individual conductor is opened.

4. A device for determining a direct current flowing in a conductor during a process harnessing the direct current, the direct current having an amplitude greater than 500 A and being composed of a number of time-dependent partial currents flowing in first and second individual conductors having first and second switching elements, respectively, the device comprising at least one integrator and at least one Rogowski coil arranged around at least the first individual conductor for the induction of a partial voltage by the partial current in the first individual conductor, wherein each of the first and second individual conductors is formed by a respective path of a rectifier on a secondary side of transformer with central tapping, wherein the at least one integrator is designed for integration of the partial voltage, wherein the at least one integrator is connected to an evaluation unit for determining of the direct current, wherein during the process the partial current flowing in the first individual conductor is measured and becomes zero temporarily while partial current flows simultaneously in the second individual conductor, and wherein the at least one integrator is connected to the at least one Rogowski coil and is configured to be reset when the partial current in the first individual conductor is zero.

5. The device according to claim 4, wherein the first and second individual conductors run equally opposed and the at least one Rogowski coil comprises one Rogowski coil arranged around the first and second individual conductors, and wherein the one Rogowski coil is connected to the at least one integrator for taking a mean value free differential voltage of a current difference of the partial currents from the first and second individual conductors.

6. The device according to claim 4, further comprising a second Rogowski coil arranged around the second individual conductor for the induction of a partial voltage via the partial current in the second individual conductor, and further comprising a second integrator for integration of the partial voltage from the second Rogowski coil, the second integrator being connected to the evaluation unit, and wherein the second integrator is periodically reset during the flowing of direct current, when the partial current flowing in the second individual conductor is ≤ zero.

7. The device according to claim 6, wherein the at least one integrator is respectively connected to the switching element of the first individual conductor so that the at least one integrator can be reset, when the switching element of the first individual conductor is opened.

8. The device according to claim 4, wherein the switching elements are formed by diodes.

9. The device according to claim 4, further comprising a second Rogowski coil arranged around the second individual conductor for the induction of a partial voltage via the partial current in the second individual conductor, wherein the at least one integrator comprises a first integrator, and wherein the at least one first Rogowski coil and the second Rogowski coil are each connected to the first integrator.

10. The device according to claim 4, wherein each the at least one Rogowski coil is provided with a shielding plate.

11. The device according to claim 4, wherein the at least one integrator is connected to a memory.

12. A device for resistance welding having two electrodes which are movable relative to one another and connected to a power source for providing a direct current having an amplitude greater than 500 A for welding, wherein the power source comprises at least one transformer and one rectifier having switching elements for delivering time-dependent partial currents flowing in first and second individual conductors, and having an apparatus for determining the direct current flowing in the first and second individual conductors during a welding process, the apparatus comprising at least one integrator and at least one Rogowski coil arranged around at least the first individual conductor for the induction of a partial voltage through the partial current in the first individual conductor, wherein each of the first and second individual conductors is formed by a respective path of the rectifier on the secondary side of a transformer with central tapping, wherein the at least one integrator is designed for the integration of the at least one partial voltage, wherein the at least one integrator is connected to an evaluation unit for determining the direct current, wherein during the process the partial current flowing in the first individual conductor is measured and becomes zero temporarily while partial current flows simultaneously in the second individual conductor, and wherein the at least one integrator is connected to the at least one Rogowski coil and is configured to be reset when the partial current in the first individual conductor is zero.

13. A device for determining a direct current flowing in a conductor and having an amplitude greater than 500 A, which direct current is composed of a number of time-dependent partial currents flowing in individual conductors having switching elements, the device comprising at least one integrator and at least two Rogowski coils arranged around at least two equally opposed individual conductors for the induction of a partial voltage by the at least one partial current, wherein each of the individual conductors is formed by a path of a rectifier on a secondary side of transformer with central tapping, wherein the at least one integrator is designed for integration of the at least one partial voltage, wherein the at least one integrator is connected to an evaluation unit for determining of the direct current, and wherein the at least two Rogowski coils are connected to each other and to the at least one integrator for taking a mean value free sum voltage from the partial voltages induced in the at least two Rogowski coils.

14. A method for determining a direct current and having an amplitude greater than 500 A, the direct current being composed of a number of time-dependent partial currents flowing in at least two individual conductors having respective switching elements, wherein at least two partial voltages are induced by the partial currents flowing in the at least two individual conductors by arranging a respective Rogowski coil around each of the at least two individual conductors, wherein each of the at least two individual conductors is formed by a path of a rectifier on a secondary side of transformer with central tapping, wherein the induced partial voltage is integrated in at least one integrator and the direct current is determined with an evaluation unit connected to the at least one integrator, wherein the two Rogowski coils are wired equally opposed, wherein a mean free sum voltage is formed of the at least two partial voltages induced in the two Rogowski coils wired equally opposed, and wherein the mean free sum voltage is integrated in the at least one integrator.

* * * * *